United States Patent
Curran et al.

(10) Patent No.: US 11,751,349 B2
(45) Date of Patent: *Sep. 5, 2023

(54) ANODIZED PART HAVING A MATTE BLACK APPEARANCE

(71) Applicant: Apple Inc., Cupertino, CA (US)

(72) Inventors: James A. Curran, Sunnyvale, CA (US); Aaron D. Paterson, Livermore, CA (US); Sonja R. Postak, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/866,248

(22) Filed: May 4, 2020

(65) Prior Publication Data

US 2020/0383224 A1 Dec. 3, 2020

Related U.S. Application Data

(60) Provisional application No. 62/853,629, filed on May 28, 2019.

(51) Int. Cl.
*C25D 11/14* (2006.01)
*H05K 5/04* (2006.01)
(Continued)

(52) U.S. Cl.
CPC .............. *H05K 5/04* (2013.01); *B32B 3/12* (2013.01); *C25D 11/14* (2013.01); *C25D 11/16* (2013.01);
(Continued)

(58) Field of Classification Search
CPC .................................................. C25D 11/14
See application file for complete search history.

(56) References Cited

U.S. PATENT DOCUMENTS 4,111,762 A * 9/1978 Wade ............... C25D 11/08
205/208
4,589,972 A * 5/1986 Pompea ............ F24S 70/225
205/205

(Continued)

FOREIGN PATENT DOCUMENTS

CN 104203555 A 12/2014
CN 105430980 A 3/2016
(Continued)

OTHER PUBLICATIONS

Rhopoint Instruments, "What is a gloss unit?", 2014, p. 1; Accessed at https://web.archive.org/web/20141029040814/http://www.rhopointinstruments.com:80/faqs/what-is-a-gloss-unit/.*

(Continued)

*Primary Examiner* — Mark Ruthkosky
*Assistant Examiner* — Julia L Rummel
(74) *Attorney, Agent, or Firm* — Dorsey & Whitney LLP

(57) ABSTRACT

This application relates to an anodized part. The anodized part includes a metal substrate and an anodized layer overlaying and formed from the metal substrate. The anodized layer includes (i) an external surface that includes randomly distributed light-absorbing features that are capable of absorbing visible light incident upon the external surface, and (ii) pores defined by pore walls, where color particles are infused within the pores. The anodized layer is characterized as having a color having an L* value using a CIE L*a*b* color space that is less than 10.

10 Claims, 10 Drawing Sheets

(51) Int. Cl.
  *C25D 11/16* (2006.01)
  *C25D 11/24* (2006.01)
  *B32B 3/12* (2006.01)
  *H05K 5/02* (2006.01)
  *B32B 15/04* (2006.01)

(52) U.S. Cl.
  CPC ............ *C25D 11/246* (2013.01); *B32B 15/04* (2013.01); *H05K 5/0243* (2013.01)

(56) References Cited

U.S. PATENT DOCUMENTS

| | | |
|---|---|---|
| 2010/0243030 A1 | 9/2010 | Yago |
| 2012/0171419 A1 | 7/2012 | Russell et al. |
| 2014/0166490 A1* | 6/2014 | Tatebe .................. C25D 11/22 205/50 |
| 2014/0346049 A1 | 11/2014 | Khosla |
| 2015/0368823 A1 | 12/2015 | Curran et al. |
| 2017/0226651 A1 | 8/2017 | Curran et al. |
| 2018/0049337 A1 | 2/2018 | Curran et al. |
| 2019/0062939 A1 | 2/2019 | Curran et al. |
| 2020/0383224 A1 | 12/2020 | Curran et al. |
| 2021/0130974 A1* | 5/2021 | Kim .................... H04M 1/0283 |

FOREIGN PATENT DOCUMENTS

| | | |
|---|---|---|
| CN | 105849313 A | 8/2016 |
| CN | 107000369 A | 8/2017 |
| CN | 206559776 U | 10/2017 |
| CN | 107438340 A | 12/2017 |
| CN | 108349296 A | 7/2018 |
| CN | 109487315 A | 3/2019 |
| EP | 3088562 A1 | 11/2016 |
| WO | 2013130211 A1 | 9/2013 |
| WO | 2016093816 A1 | 6/2016 |
| WO | 2018045484 A1 | 3/2018 |
| WO | WO-2018139749 A1 * | 8/2018 ............. C23C 28/04 |

OTHER PUBLICATIONS

"铝基材组织结构z 阳极氧化铝多孔膜 结构的影响 (Influence of aluminum substrate structure on anodic alumina porous membrane structure)", 第十一次全国电化 学会议论文集 (Proceedings of the 11th National Electrochemistry Conference.

* cited by examiner

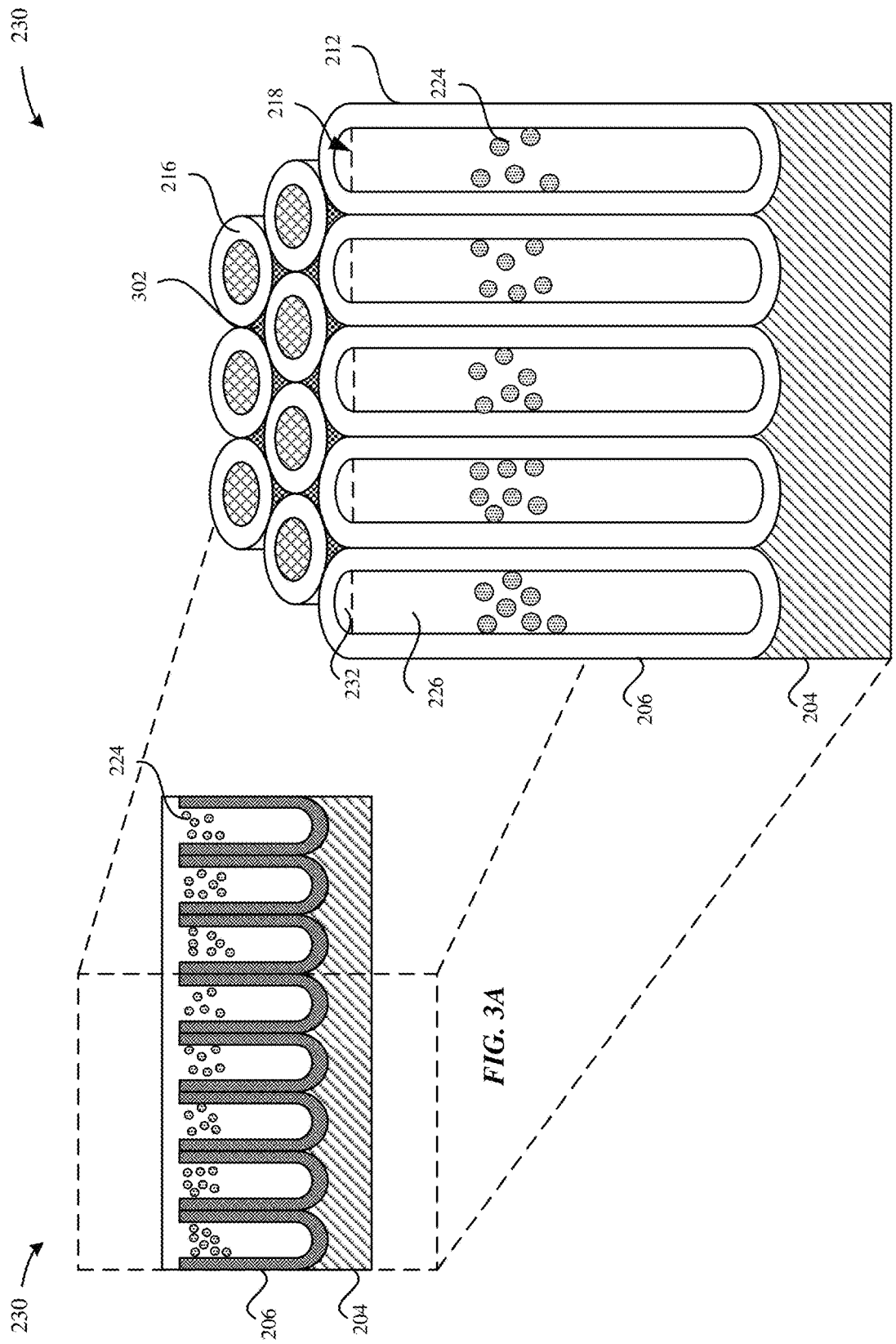

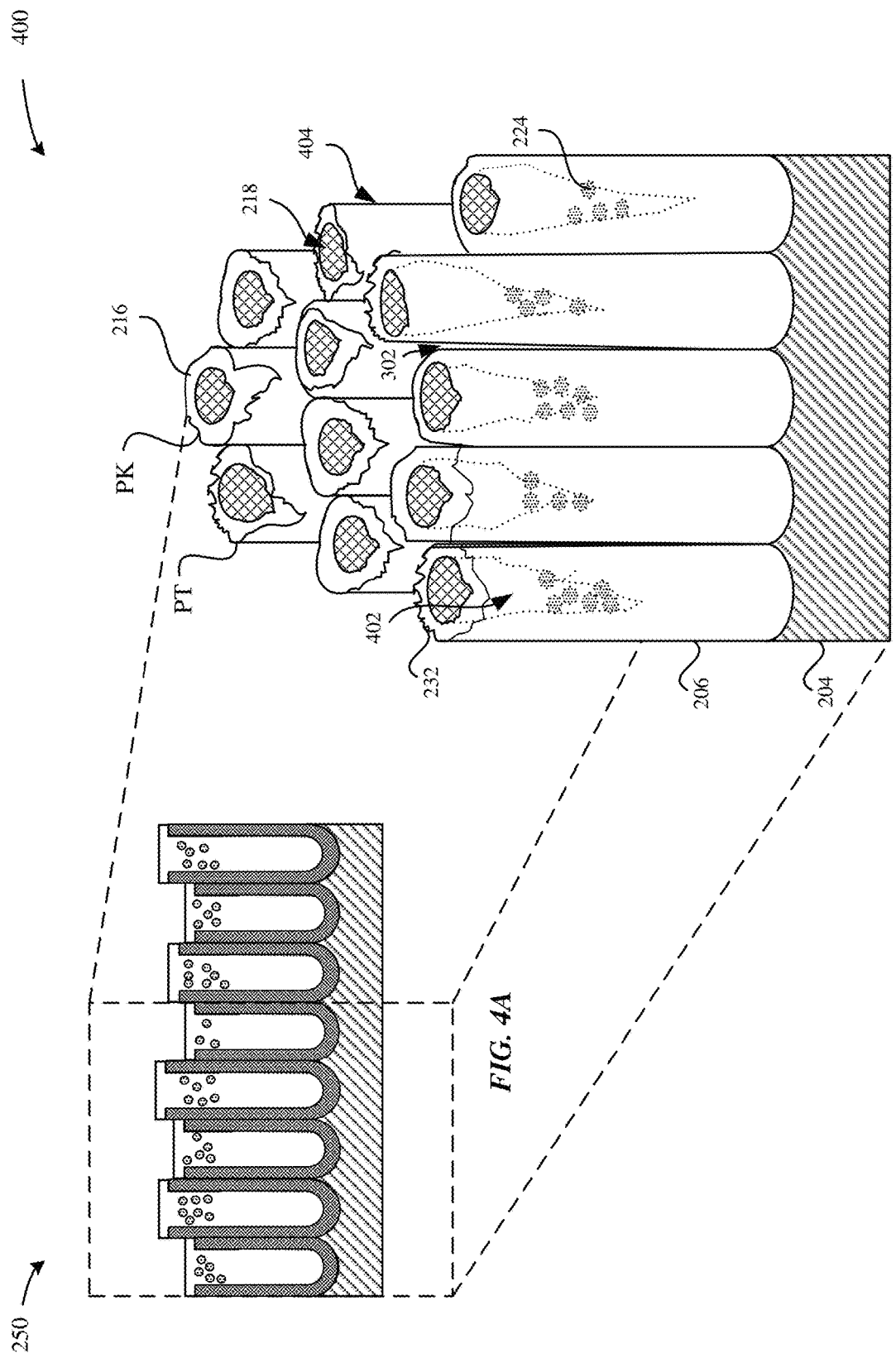

ANODIZED PART HAVING A MATTE BLACK APPEARANCE

CROSS-REFERENCE TO RELATED APPLICATION(S)

This claims priority to U.S. Provisional Patent Application No. 62/853,629, filed May 28, 2019, entitled "ANODIZED PART HAVING A MATTE BLACK APPEARANCE," the entire disclosure of which is hereby incorporated by reference.

FIELD

The described embodiments relate generally to etching a surface of a dyed anodized part. More particularly, the described embodiments relate to techniques for etching the surface of the dyed anodized part such as to form light-absorbing features that are capable of absorbing generally all visible light incident upon the external surface such as to impart a black appearance.

BACKGROUND

Enclosures for portable electronic devices can include an anodized layer that can be dyed in different colors in order to enhance their cosmetic appeal to consumers. However, certain colors are far more difficult to achieve than others. In particular, attempts by consumer electronic device manufacturers to achieve a true black color have fallen short. Indeed, the best attempts have attained only a dark grey color. One challenge to achieving a true black color is that anodized metal can have a relatively high floss finish, which is capable of specularly reflecting large amounts of visible light.

SUMMARY

The described embodiments relate generally to etching a surface of a dyed anodized part. More particularly, the described embodiments relate to techniques for etching the surface of the dyed anodized part such as to form light-absorbing features that are capable of absorbing generally all visible light incident upon the external surface such as to impart a black appearance.

According to some embodiments, an anodized part is described. The anodized part includes a metal substrate and an anodized layer overlaying and formed from the metal substrate. The anodized layer includes an external surface that includes randomly distributed light-absorbing features that absorb visible light incident upon the external surface, and pores defined by pore walls, where color particles are infused within the pores, and the anodized layer has an $L^*$ value using a CIE $L^*a^*b^*$ color space that is less than 10.

In some examples, the external surface of the anodized part includes a scallop having a diameter of 3 micrometers or greater. In another example the light-absorbing features of the absorb light incident to the external surface, the light-absorbing features being defined by peaks and pits, and the tops of the peaks are separated from bottoms of the pits by a clearance distance of 2 micrometers or less. In some examples, the pits of the anodized part have diameters less than 2 micrometers. In yet other examples, the peaks of the anodized parts have varied heights. In other examples, the pores of the anodized part are sealed. In some examples, the color particles include dye pigments or an electrodeposited metal. According to another example, the anodized layer has a gloss, as measured at 85 degrees, of less than 10 gloss units.

According to some embodiments, an enclosure for a portable electronic device is described. The enclosure includes a substrate that includes metal and an anodized layer that overlays the substrate. The anodized layer includes nano-scale tubes having color particles infused therein, and an external surface having peaks of varying heights that are separated by pits of varying depths, where the anodized layer is characterized as having a gloss appearance, as measured at 85 degrees, of less than 10 gloss units.

According to some embodiments, the openings of the nano-scale tubes are sealed. In some other examples of the enclosure, the tops of the peaks are separated from bottoms of adjacent pits by a clearance distance of 2 micrometers or less. The pits can, in some examples, have diameters of 2 micrometers or less. In some examples, the enclosure is a thermal dissipation component. The anodized layer can, in some examples, have an $L^*$ value of less than 10 using a CIE $L^*a^*b^*$ color space. In some examples, the color particles in the enclosure include dye pigments or an electrodeposited metal.

According to some embodiments, a method for forming an enclosure for a portable electronic device is described. The method includes forming an anodized layer that overlays a metal substrate, infusing color particles within pores of the anodized layer, and forming light-absorbing features on an external surface of the anodized layer by etching the external surface such that the anodized layer has a color having an $L^*$ value that is less than 10 using a CIE $L^*a^*b^*$ color space.

According to some examples, the method for forming the enclosure for a portable electronic device includes sealing the pores of the anodized layer prior to forming the light-absorbing features. In some examples, the light-absorbing features are defined by peaks and pits, and tops of the peaks are separated from bottoms of the pits by a distance of 2 micrometers or less. The tops of the peaks can have varying heights, and the bottoms of the pits have varying depths. In some examples, the pits have diameters less than 2 micrometers.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

FIGS. 3A-3B illustrate various views of a sealed anodized part prior to undergoing an etching process, in accordance with some embodiments.

FIGS. 4A-4B illustrate various views of a sealed anodized part subsequent to undergoing an etching process, in accordance with some embodiments.

DETAILED DESCRIPTION

Figure 1:
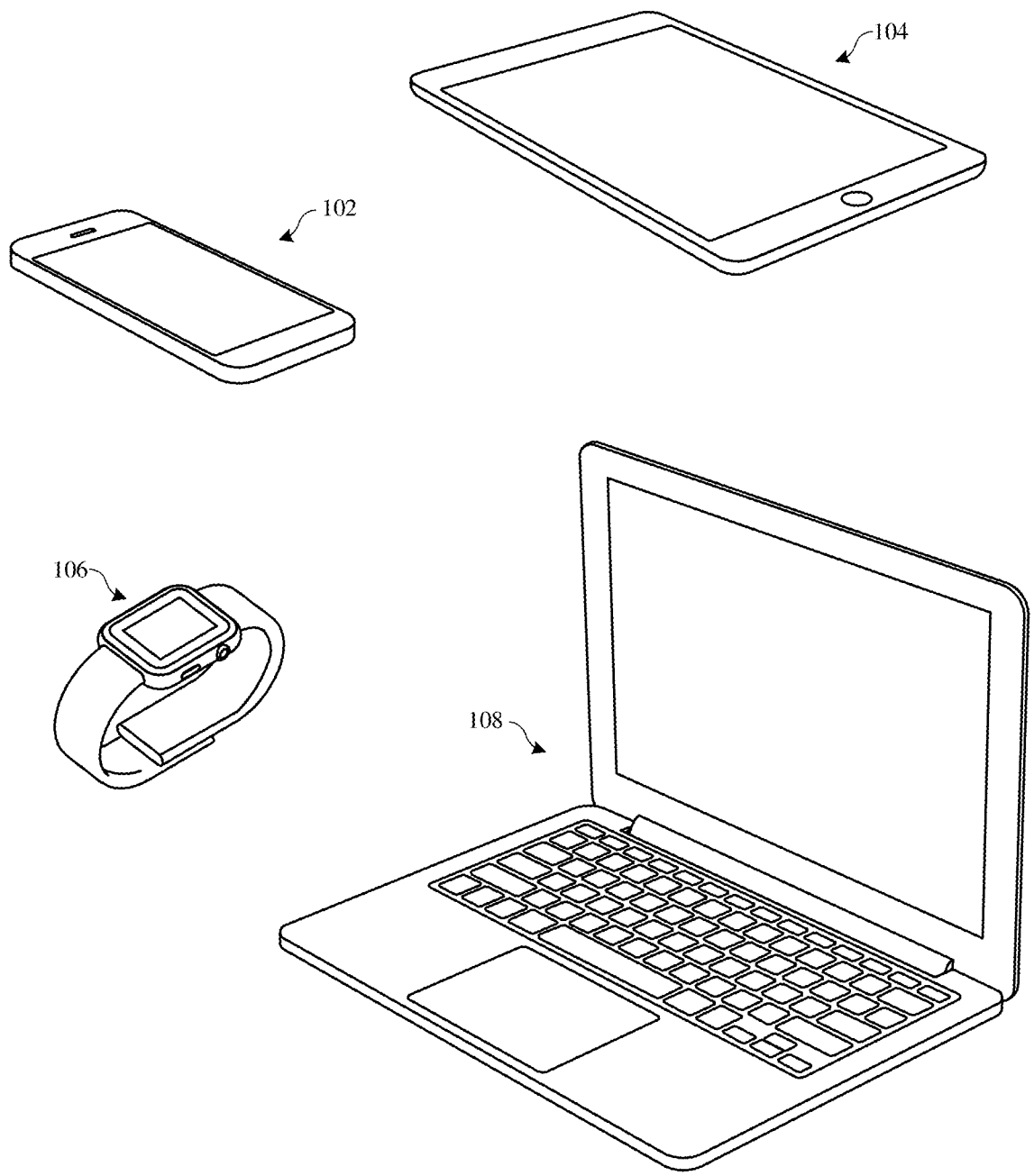
FIG. 1 illustrates perspective views of various portable electronic devices having enclosures that can be processed using the techniques described herein, in accordance with some embodiments.

Representative applications of methods and apparatus according to the present application are described in this section. These examples are being provided solely to add context and aid in the understanding of the described embodiments. It will thus be apparent to one skilled in the art that the described embodiments can be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments can be used, and changes can be made without departing from the spirit and scope of the described embodiments.

Although enclosures formed of anodized metal can be dyed a variety of different colors, it is well established that dyeing the enclosures certain colors, such as black, is notoriously difficult to achieve. The best attempts in the industry have only been able to attain a dark grey color. For example, merely depositing dye particles within pores of an anodized layer is insufficient to impart a true black color. Indeed, the anodized layer plateaus at an L* value in the low 20s. Part of the challenge to achieving a true black color is that the surface of these enclosures generally has a high gloss finish, which contributes to specular reflection of a large amount of visible light.

The embodiments described herein set forth techniques for etching an external surface of the anodized layer to form light-absorbing features that absorb generally all visible light that is incident upon the external surface. Additionally, whatever visible light that is not absorbed by these light-absorbing features is diffusely reflected by the external surface. As a result, the external surface is characterized as having a low gloss, matte finish.

As used herein, the terms anodic film, anodized film, anodic layer, anodized layer, anodic oxide coating, anodic layer, anodic oxidized layer, metal oxide layer, oxide film, oxidized layer, and oxide layer can be used interchangeably where appropriate. In one example, an anodized layer can result from an electrochemical anodization process of aluminum or an aluminum alloy. In another example, metal oxide layers can result from a deposition process. The metal substrate can include any of a number of suitable metals or metal alloys thereof such as aluminum, titanium, steel, and the like. It should be noted that the processes for forming an anodized layer and a metal oxide layer can be different. As used herein, the terms part, layer, segment, and section can also be used interchangeably where appropriate.

According to some embodiments, an anodized part is described. The anodized part includes a metal substrate and an anodized layer overlaying and formed from the metal substrate. The anodized layer includes an external surface that includes randomly distributed light-absorbing features that absorb visible light incident upon the external surface, and pores defined by pore walls, where color particles are infused within the pores, and the anodized layer has an L* value using a CIE L*a*b* color space that is less than 10.

These and other embodiments are discussed below with reference to FIGS. 1-8; however, those skilled in the art will readily appreciate that the detailed description given herein with respect to these figures is for explanatory purposes only and should not be construed as limiting.

FIG. 1 illustrates various portable electronic devices that can be processed using the techniques as described herein. The techniques as described herein can be used to process metallic surfaces of enclosures of the portable electronic devices. In some examples, the enclosures can include at least one of metal, a metal alloy, a polymer, or a thermoplastic. In some examples, the techniques described herein can be used to color metallic surfaces by causing color particles (e.g., water-soluble pigments, etc.) to become absorbed within the metallic surfaces. In some examples, the techniques described herein can be used to seal pore structures of anodized layers such as to prevent external contaminants from reaching the underlying metal substrate via the pores. Additionally, sealing the pore structures also prevents the dye particles from leaching out of the anodized layer.

FIG. 1 illustrates exemplary portable electronic devices including a smartphone 102, a tablet computer 104, a smartwatch 106, and a portable computer 108. These exemplary portable electronic devices can be capable of using personally identifiable information that is associated with one or more users. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

According to some embodiments, the exemplary portable electronic devices can include enclosures that can benefit from absorbing generally all visible light that is incident upon an external surface of the enclosure. For example, the smartphone 102 can include an internal structure such as a camera housing, where it can be beneficial for the camera housing to have a colored black surface that absorbs generally all visible light such as to prevent and/or minimize reflections of visible light that would otherwise affect an amount of light detected by a sensor of the camera. In another example, the enclosure of the portable computer 108 can function as a heat dissipater, such as a heatsink, that is colored black to efficiently draw heat and dissipate heat generated by operational components (e.g., battery, processor, etc.) carried within the portable computer 108. When an enclosure that is colored black absorbs light, the enclosure can transform the light into heat. Accordingly, implementing the techniques described herein for coloring an anodized layer a true black can cause the enclosure to absorb a greater amount energy and promote cooling from within. As described herein, a true black color can refer to an L* value of <10 or an L* value of <5.

Surface(s) of the portable electronic devices can assume any number of desired surface geometries and surface finishes. In some examples, the enclosures can have a three-dimensional structure having a height, width, and depth, and any type of geometry. In particular, the enclosures is characterized as rectangular, polygonal, circular, beveled edges, angular edges, elliptical, etc.

As will be described herein, the etched anodized surface of the enclosures having light-trapping features (also referred to as light-absorbing features) is capable of absorbing generally almost all visible light incident thereupon. Additionally, whatever visible light not absorbed by the light-trapping features is diffusely reflected by the light-trapping features. As a result, the etched anodized part is characterized as having a matte, low gloss finish. The matte, low gloss finish combined with black color particles infused within pores are capable of hiding surface geometries of the external surface.

The anodized layer can have sufficient hardness such that the anodized layer functions as a protective coating to protect the metal substrate, for example, when these portable electronic devices are dropped, scratched, chipped, abraded, or exposed to various corrosive contaminants. In some examples, the anodized layer includes pore structures (also referred to as nanotubes herein) that are formed through a portion of the anodized layer. The pore structures extend from an external surface of the anodized layer and terminate at a bottom surface/terminus surface. The anodized layer can be separated from the underlying metal substrate by a non-porous barrier layer.

The pore structures of the anodized layer is capable of receiving color particles which can imbue the anodized layer with a specific color that corresponds to the dye particles. In particular, the anodized layer can be colored prior to sealing the anodized layer. For example, the anodized layer can be dyed such as to imbue the anodized layer with a wide range of colors. In particular, the pore structures can have a diameter between about 20 nm to about 40 nm, which is large enough to receive the dye particles. Several parameters can influence and control uptake of dye particles into the pore structures such as dye concentration, chemistry of the dye solution, pH of dye solution, temperature of dye solution, and dyeing time, as will be described in greater detail herein. Subsequent to dyeing the metallic surface, the pore structures are sealed so that the dye particles are physically retained within the pore structures.

In some examples, the color of the anodized layer can be characterized according to CIE L*a*b* color-opponent dimension values. The L* color opponent dimension value is one variable in an L*a*b* color space. In general, L* corresponds to an amount of lightness. L*=0 represents an extreme black while L*=100 represents white. In general, a* indicates amounts of red color and green color in a sample. A negative a* value indicates a green color, while a positive a* value indicates a red color. Accordingly, samples having a positive a* value will indicate that more red than green is present. In general, b* indicates amounts of blue color and yellow color in a sample. A negative b* value indicates a blue color, while a positive b* value indicates yellow color. Accordingly, samples having a positive b* value will indicate more yellow than blue is present.

Figure 2A:
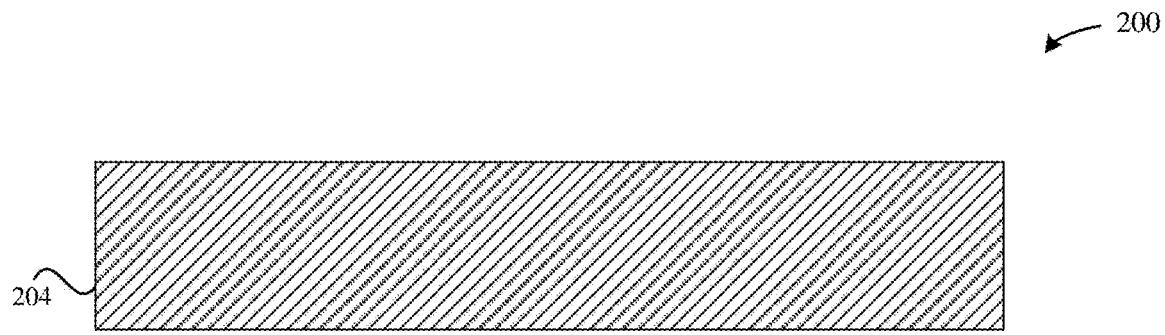
FIGS. 2A-2B illustrate cross-sectional views of a process for forming an anodized part, in accordance with some embodiments.
Figure 2B:
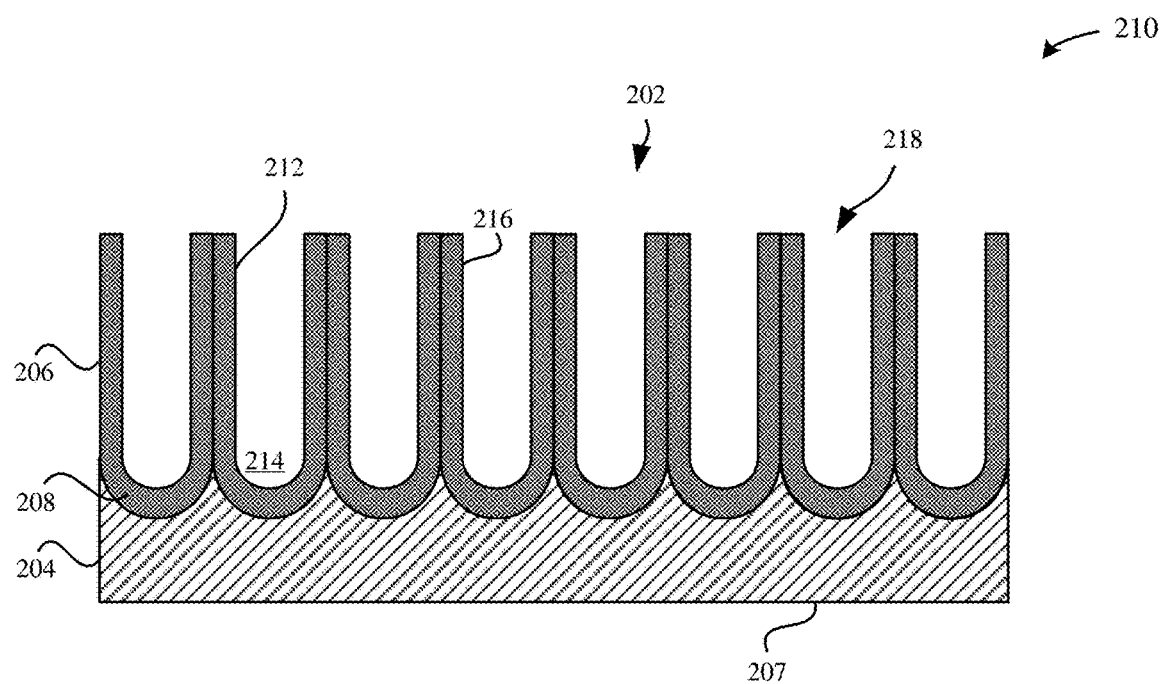

FIGS. 2A-2B illustrate cross-sectional views of a process for forming an anodized part, in accordance with some embodiments. In some embodiments, a metal part 200 that is being processed has a near net shape of a final part, such as the enclosures of the portable electronic devices 102, 104, 106, and 108.

FIG. 2A illustrates the metal part 200 prior to undergoing an anodization process. In some examples, the metal part 200 can correspond to a metal substrate 204. The metal substrate 204 can have any thickness that is suitable for providing sufficient strength, hardness and rigidity to protect electronic component(s) that are carried within the portable electronic device and to protect brittle components (e.g., ceramic, glass, etc.) of the enclosure. The metal substrate 204 can be subject to one or more pre-anodization processes, such as at least one of polishing, blasting, buffering, cleaning, and the like.

FIG. 2B illustrates an anodized part 210, in accordance with some embodiments. For example, the anodized part 210 corresponds to the metal substrate 204 after undergoing the anodization process. As illustrated in FIG. 2B, an anodized layer 206 is formed from and overlays the metal substrate 204. The anodized layer 206 can include an external surface 202, and the external surface 202 of the anodized layer 206 can be generally parallel to a bottom surface 207 of the metal substrate 204. In some examples, the anodized layer 206 is formed as a result of an electrolytic anodizing process. In particular, during the electrolytic anodizing process, a portion of the metal substrate 204 is converted or consumed by the conversion to the anodized layer 206.

According to some examples, the anodized layer 206 has a thickness between about 1 micrometers and several tens of micrometers. In some examples, the thickness is between about 5 micrometers and about 15 micrometers. The anodized layer 206 can be separated from the underlying metal substrate 204 by a non-porous barrier layer 208.

According to some embodiments, the anodized layer 206 includes nanotubes 212 that extend from the external surface 202 towards the metal substrate 204. The nanotubes 212 can terminate at a terminus 214 surface. The nanotubes 212 are defined by pore walls 216 that are characterized as having generally columnar shapes that are elongated in a direction generally perpendicular to a central plane of the external surface 202 of the anodized part 210. The nanotubes 212 include openings 218 that can be sealed via a sealing process, as described in greater detail herein.

Figure 2C:
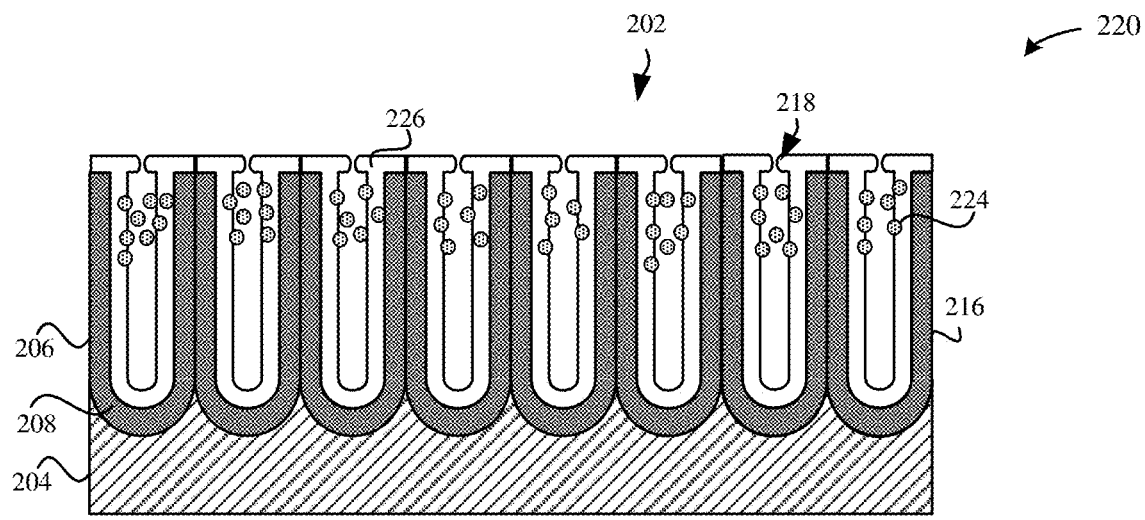
FIGS. 2C-2D illustrate cross-sectional views of a process for sealing an anodized part, in accordance with some embodiments.
Figure 2D:
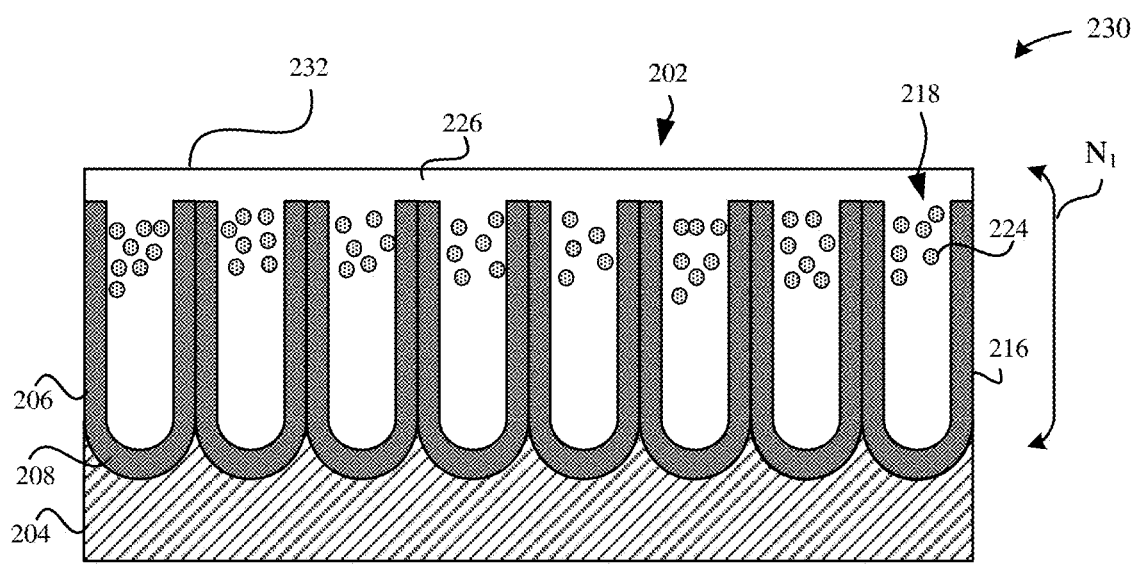

FIGS. 2C-2D illustrate cross-sectional views of a process for forming a colored, sealed anodized part, in accordance with some embodiments. FIG. 2C illustrates a partially-sealed part 220, subsequent to undergoing an optional coloring process, in accordance with some embodiments. In particular, FIG. 2C illustrates that the partially-sealed part 220 includes color particles 224 that are disposed/infused within the nanotubes 212. In some examples, the color particles 224 can be used in combination with the etching techniques described herein to impart the partially-sealed part 220 with a true black color (e.g., L*<10). In some examples, the true black color can be achieved by dyeing the partially-sealed part 220 using organic, water-soluble pigments. In other examples, the true black color can be achieved by electrodepositing metal (e.g., Co, Sn, etc.) into the nanotubes 212 via an electrocoloring process. As the anodized layer 206 is highly porous, the nanotubes 212 should be sealed once the color particles 224 are deposited into the nanotubes 212 so as to permanently lock in the color.

According to some embodiments, the color particles 224 can be distributed within the nanotubes 212 in a random distribution or a uniform distribution. Typically, there will be a higher concentration of color particles 224 near the outer extremities of the nanotubes 212. However, high concentrations of colorant, prolonged coloring times or high temperatures can minimize the uptake of the color particles 224 and achieve relatively uniform color throughout the anodized layer 206. During the coloring process, the color particles 224 bind to sites of the pore walls 216.

FIG. 2C illustrates the partially-sealed part 220 during a hydrothermal sealing process, in accordance with some embodiments. In some examples, the partially-sealed part 220 represents the anodized part 210 during the hydrothermal sealing process. According to some embodiments, the anodized part 210, subsequent to a coloring process, is exposed to a sealing solution. The sealing process involves hydrating the amorphous alumina surfaces of the pore walls 216 to a gel of boehmite ($Al_2O_3.H_2O$) and/or bayerite ($Al_2O_3.3H_2O$) such that the amorphous aluminum material swells and closes the openings 218 of the nanotubes 212. The sealing process can be enhanced by using zinc acetate which additionally precipitates metal hydroxides in the nanotubes 212 and accelerates the sealing process. In some examples, the hydrothermal sealing process can be performed in steam, hot water (e.g., at or near boiling temperature so as to reduce smutting), or at a temperature as low as about 70° C. The hydrothermal sealing process causes precipitation of hydrated aluminum oxide (e.g., boehmite, etc.). In particular, the hydrothermal sealing process causes swelling of the aluminum oxide of the anodized layer 206 while immersed in the sealing solution. Swelling of the aluminum oxide causes the openings 218 to narrow, thereby minimizing external elements from diffusing into the nanotubes 212. Swelling of the openings 218 can also cause oxidized fragments or metal oxide material to be retained within the anodized layer 206. During the hydrothermal sealing process, the alumina (of aluminum oxide) is converted to a hydrated material 226, such as aluminum oxide hydroxides (e.g., boehmite, diaspore, etc.) that results in swelling or volume increase of the oxide surfaces to partially close or partially seal the openings 218 of the nanotubes 212. In some examples, the hydrated material 226 uniformly lines the pore walls 216 of the nanotubes 212.

FIG. 2D illustrates a sealed part 230 subsequent to a completion of the hydrothermal sealing process. As a result of the hydrothermal sealing process, the openings 218 are sealed with a seal 232, such as the hydrated material 226 (e.g., boehmite, diaspore, etc.). The hydrothermal sealing process locks the color particles 224 into the nanotubes 212 and also protects the nanotubes 212 from stains, dirt, external contaminants, and the like. Locking the color is important in the consumer electronics industry where uniform color between dyed parts and an overall, uniform cosmetic appearance is considered highly attractive.

As shown in FIG. 2D, the sealed part 230 includes nanotubes 212 that each have equal or nearly equal lengths and diameters. As shown in FIG. 2D, the nanotubes 212 are characterized as having a length ($N_1$) between the terminus surface 214 and the external surface 202. Furthermore, the nanotubes 212 can be characterized as having generally uniform heights. Accordingly, the external surface 202 can be characterized as having a generally planar surface.

Although the sealed part 230 incorporates color particles 224, it should be noted that merely incorporating color particles 224 within the nanotubes 212 is insufficient to impart the anodized part (e.g., the anodized part 210, the partially-sealed part 220, the sealed part 230, etc.) with a true black color. As described herein, the term "true black" can refer to an anodized part having a color with an L* value that is less than 10 using a CIE L*a*b* color space. Additionally, the term "true black" can also refer to an anodized part that absorbs approximately 99% or greater of visible light. Indeed, even when infusing a fully saturated black dye in an anodized part, the anodized part will have a minimum L* value of at least ~25. Electro-coloring the anodized part can yield a slightly darker grey color having a minimum L* value of at least ~20. In other words, in both instances, the use of dyeing and eletrocoloring techniques causes the anodized part to more closely resemble a dark grey color. Thus, both coloring techniques are insufficient to impart the anodized part with a true black color. In order to achieve a true black color, the anodized part (e.g., the sealed part 230) must be subjected to an etching process, as will be described herein.

Figure 2E:
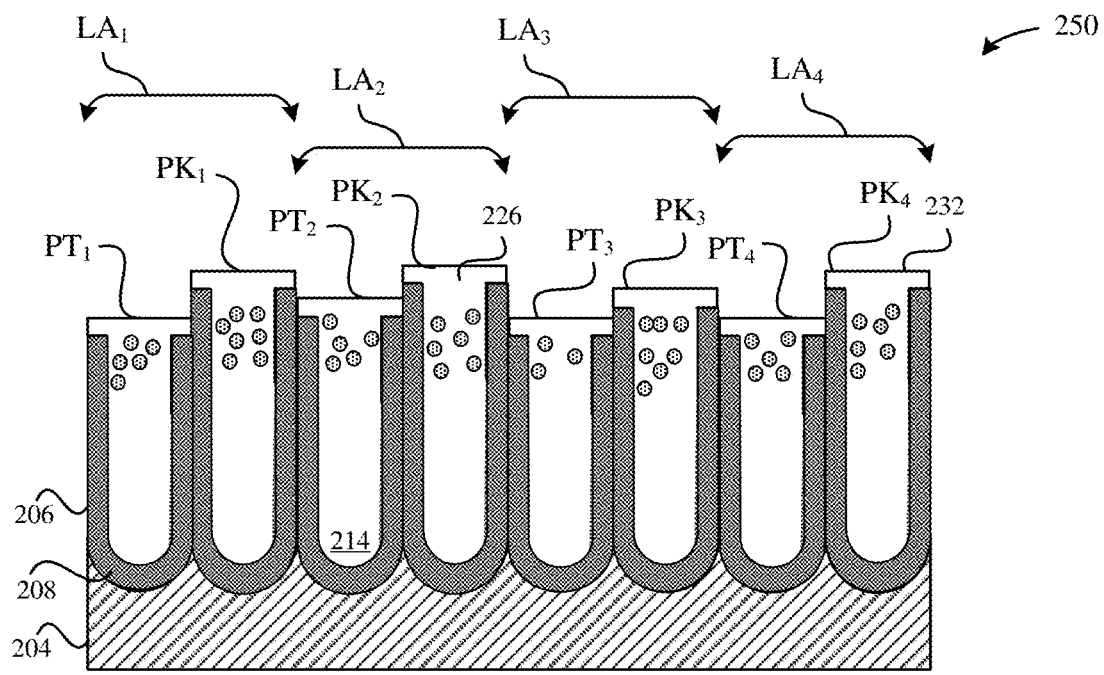
FIGS. 2E-2F illustrate cross-sectional views of a process for etching an anodized part, in accordance with some embodiments.
Figure 2F:
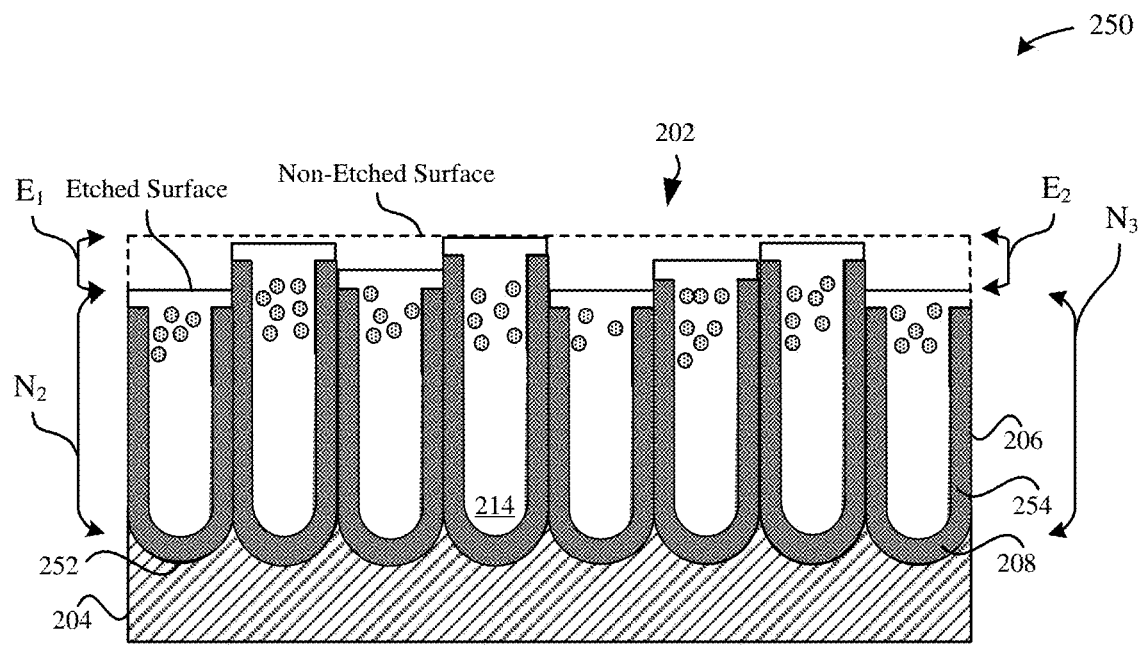

FIGS. 2E-2F illustrate cross-sectional views of a process for forming an etched anodized part, in accordance with some embodiments. In particular, FIG. 2E illustrates the etched part 250 subsequent to the etching processes. The color particles 224 disposed within the nanotubes 212 and the hydrated material 226 that includes the seal 232 are not generally disturbed by the etching process. As a result, the anodized layer 206 of the etched part 250 remains sealed and includes generally the same amount of the color particles 224.

In contrast to the sealed part 230, the external surface 202 of the etched part 250 is generally non-planar due to the etching process. In particular, the etching process is associated with stochastic etching of the pore walls 216 of the nanotubes 212 that causes the nanotubes 212 to have varied heights. The stochastic etching of the pore walls 216 results in the external surface 202 of the anodized layer 206 having an extremely fine surface texture. The etched surface texture creates pits and peaks on the micron and sub-micron scale. In some embodiments, the pits and peaks can also be referred to as valleys and peaks.

According to some examples, the sealed part 230 is etched by exposing the sealed part 230 to a phosphoric acid solution. In some examples, the sealed part 230 is exposed to an 85% phosphoric acid solution at a temperature of about 70° Celsius from between about 15-60 seconds. One of ordinary skill in the art would understand that an etching time in excess of 60 seconds would lead to degradation of the seal 232 while an etching time of less than 15 seconds is insufficient to form the light-absorbing features.

FIG. 2E illustrates that the anodized layer 206 includes pits ($PT_{1-4}$) that are each separated by peaks ($PK_{1-4}$) by a distance. As the tops of the peaks ($PK_{1-4}$) are of varied heights, the bottoms of the pits ($PT_{1-4}$) are of varied depths, then the distance separating the tops of the peaks ($PK_{1-4}$) from the bottoms of the pits ($PT_{1-4}$) is also varied. The separation distance is at least sufficient to cause diffuse reflection of generally all visible light incident upon the external surface 202 that is not absorbed by the anodized layer 206. In one example, the distance separating the tops of the peaks from bottoms of adjacent pits can be a clearance distance of approximately 2 micrometers or less. Indeed, it is well understood in the art, that matte appearance is a direct function of the separation distance between peaks and pits. In particular, diffusion of visible light is caused when a light ray incident upon the external surface 202 is scattered in many different angles instead of a single angle as compared to specular reflection. In other words, the anodized layer 206 of the etched part 250 can be characterized a very low gloss appearance. The anodized layer 206 of the etched part 250 can have a matte appearance, as measured at 85 degrees, of less than 10 gloss units. It should be noted that a true black appearance cannot be achieved with an anodized part having a high gloss appearance because the external surface of a high gloss anodized part specularly reflects a substantial portion of visible light. Accordingly, it can be necessary in some embodiments to etch the external surface 202 of the anodized layer 206 to form the pits and peaks.

Furthermore, FIG. 2E illustrates that the external surface 202 of the anodized layer 206 includes at least one light-absorbing feature (LA). In particular, FIG. 2E illustrates light-absorbing features ($LA_{1-4}$), where each of the light-absorbing features ($LA_{1-4}$) is defined by at least one pit (e.g., $PT_1$) and at least one peak (e.g., $PK_1$). For example, the light-absorbing feature ($LA_1$) can be defined by ($PT_1$) and ($PK_1$), ($LA_2$) can be defined by ($PT_2$) and ($PK_2$), ($LA_3$) can be defined by ($PT_3$) and ($PK_3$), and ($LA_4$) can be defined by ($PT_4$) and ($PK_4$). The light-absorbing features can be superimposed throughout generally the entire external surface 202. According to some embodiments, the light-absorbing features can also be referred to as light-trapping features. According to some embodiments, the pits can also be referred to as valleys.

In some embodiments, the light-absorbing feature (LA) is capable of absorbing generally all visible light (e.g., approximately 99% or more) incident upon the external surface 202. In particular, the light-absorbing feature (LA) can trap visible light therein. Using the light-absorbing feature (LA) causes the anodized layer 206 to absorb far more visible light than would otherwise be capable in a non-etched anodized part that only includes color particles. As illustrated in FIG. 2E, the etched part 250 includes the light-absorbing features (LA) and the color particles 224 that together combine to impart the etched part 250 with a true black appearance. In some examples, the anodized layer 206 can be quantified as having an extremely matte black appearance with an L* value of ~1, an a* value of ~0, and a b* value of ~0 using a CIE L*a*b* color space.

Furthermore, the light-absorbing feature (LA) defined by the pits ($PT_{1-4}$) and peaks ($PK_{1-4}$) are also capable of diffusely reflecting generally all visible light incident upon the external surface 202. Accordingly, the anodized layer 206 can be quantified as having an extremely matte appearance with a gloss unit of <1 as measured at 20 degrees, a gloss unit of <1 as measured at 60 degrees, and a gloss unit of <10 as measured at 85 degrees. Furthermore, the anodized layer 206 can also be characterized as having a velvet appearance due to the diffuse reflection properties.

FIG. 2F illustrates a cross-sectional view of the etched part 250, in accordance with some embodiments. In particular, FIG. 2F illustrates the random distribution of the pits (PT) and peaks (PT) along the external surface 202 of the anodized layer 206. Moreover, FIG. 2F illustrates a comparison between the etched external surface of the etched part 250 and the non-etched external surface of the sealed part 230. For example, a first nanotube 252 is illustrated as having a length ($N_2$) from the external surface 202. Additionally, an amount of the pore wall 216 that defines the first nanotube 252 is removed as a result of the etching process, thereby causing a removal of a first etched amount ($E_1$) relative to the non-etched external surface. Additionally, a second nanotube 254 is illustrated as having a length ($N_3$) from the external surface 202. Additionally, an amount of the pore wall 216 that defines the second nanotube 254 is removed as a result of the etching process, thereby causing a removal of a second etched amount ($E_2$) relative to the non-etched external surface. The second etched amount ($E_2$) is greater than the first etched amount ($E_1$). Therefore, the respective pits and peaks of the first and second nanotubes, 252, 254 have different depths and heights, respectively.

FIGS. 3A-3B illustrate various views of a sealed anodized part, in accordance with some embodiments. In some examples, FIG. 3A illustrates the sealed part 230 of FIG. 2D, and FIG. 3B illustrates a magnified cross-sectional and perspective view of the sealed part 230. As illustrated in FIG. 3A, the sealed part 230 includes generally columnar nanotubes 212 that extend from the external surface 202 to the metal substrate 204. Subsequent to the anodization process, and prior to any machining, buffing, and/or polishing process that modifies the external surface 202, the external surface 202 of the sealed part 230 can be characterized as being generally planar due to the nanotubes 212 having generally uniform lengths.

FIG. 3B illustrates a magnified cross-sectional and perspective view of the sealed part 230, in accordance with some embodiments. As illustrated in FIG. 3B, openings 218 of the nanotubes 212 are sealed with a seal 232. In some examples, the hydrated material 226 of the seal 232 can overlay the color particles 224. Additionally, the nanotubes 212 are separated by knit lines 302. The knit lines 302 can also be filled with the hydrated material 226. Beneficially, the seal 232 extends to a depth of several micrometers (e.g., between 3 to 5 micrometers) and is generally sufficient to prevent external contaminants from passing through the nanotubes 212 and reaching the metal substrate 204. Additionally, the seal 232 can also promote retention of the color particles 224 within the nanotubes 212.

The nanotubes 212 include color particles 224 that are infused therein such as to impart the anodized layer 206 that is sealed with a predetermined color, such as dark grey, grey, pink, blue, orange, red, and the like. In some examples, the color particles 224 are organic water-soluble pigments or electrodeposited metals (e.g., Sn, Co, etc.). However, merely depositing color particles 224 having a black color within the nanotubes 212 is insufficient to impart the anodized layer 206 with a true black color. In order to achieve a true black color, the external surface 202 of the anodized layer 206 is also subjected to an etching process to form light-absorbing features.

FIGS. 4A-4B illustrate various views of an etched anodized part, in accordance with some embodiments. In some examples, FIG. 4A illustrates the etched part 250 of FIGS. 2E-2F, and FIG. 4B illustrates a magnified and cross-sectional view of the etched part 250. As illustrated in FIG. 4A, the etched part 250 includes generally columnar nanotubes 212 that extend from the external surface 202 to the metal substrate 204. However, subsequent to the etching process, the external surface 202 is textured (i.e., non-planar). In particular, the nanotubes 212 are etched in a stochastic manner such that peaks (PK) and pits (PT) are superimposed on the external surface 202. In particular, the peaks (PK) and pits (PT) correspond to the nanotubes 212 having non-uniform lengths and/or non-uniform heights.

FIG. 4B illustrates a magnified perspective view of the etched part 250, in accordance with some embodiments. As illustrated in FIG. 4B, the openings 218 of the nanotubes 212 remain sealed with the seal 232 where the seal 232 includes a hydrated material 226 such as boehmite. In some examples, the nanotubes 212 of the sealed part 230 have a length between about 10 micrometers to about 20 micrometers. The seal 232 extends greater than 2 micrometers below the external surface 202 while the etching process causes etching of at most about 10% of the length of the nanotubes 212, or at most approximately 2 micrometers below the external surface 202 of the sealed part 230. In some examples, the pits (PT) can be separated from the tops of the peaks (PK) and/or the external surface 202 by about 2 micrometers. In other words, the seal 232 extends deeper than the extent of the etching. In some examples, external regions (e.g., the external surface 202) of the sealed part 230 is more preferentially etched than internal regions. In some examples, the etching process causes etching of about 1 micrometer from the external surface 202. The depth of etching can also be dependent upon the duration of the etching process. However, it should be noted that to one of ordinary skill in the art would not prolong the duration of the etching process at the risk of sacrificing the seal 232. In other words, the seal 232 should preferentially remain intact subsequent to the etching process such as to prevent the color particles 224 from inadvertently leaching out of the nanotubes 212.

Admittance testing was performed on the etched part 250, where admittance is a function of seal chemistry. In particular, admittance (as measured in accordance with ASTM B457) corresponds to an electrochemical resistance of the anodized layer 206. The admittance testing involves performing electrochemical impedance spectroscopy at a fixed frequency (e.g., 1 kHz). Tests show that the admittance value of the sealed part 230 and the etched part 250 are substantially equal to each other; therefore, demonstrating that the seal 232 remains intact. Other admittance testing demonstrates that the anodized layer 206 of the etched part 250 has an admittance value of greater than 30 micro Siemens, which further substantiates that the seal 232 remains intact.

FIG. 4B further illustrates that the nanotubes 212 are etched subsequent to the etching process. In particular, the pore walls 216 of the nanotubes 212 can be etched such that the pore walls 216 have textured surfaces that are capable of diffusely reflecting generally all of the visible light. During the etching process, internal regions 402 of the pore walls 216 can be more preferentially etched than the exterior regions 404 of the pore walls 216 due to the hydrated material 226 present along the internal regions 402. Despite the preferential etching, approximately 90% or more of the anodized layer 206 remains subsequent to the etching process. Furthermore, the knit lines 302 can also be etched as a result of the etching process.

FIG. 4B illustrates that pits (PT) and peaks (PK) are formed throughout the external surface 202 of the etched part 250. The combination of the pits (PT) and peaks (PK) can define light-absorbing features that are capable of absorbing generally all visible light incident upon the external surface 202. In particular, the light-absorbing feature (LA) can trap visible light therein, and can also be referred to as light-trapping features. Using the light-absorbing feature (LA) causes the anodized layer 206 to absorb far more visible light than would be otherwise possible in a non-etched anodized part that was only dyed or electrocolored.

According to some examples, each of the pits (PT) are characterized as having a generally circular shape with a diameter of less than 2 micrometers. Furthermore, the pits (PT) having bottoms of various depths that collectively define a network of nano-scale etching. The pits (PT) can be distinguished from scallops and craters that are caused by blasting the external surface 202. In particular, scallops are very shallow (i.e., <0.5 micrometers deep) and scallops have a diameter greater than 3 micrometers. However, because the scallops are so large (i.e., greater than 3 micrometers), there is insufficient spacing between adjacent scallops. As a result, the lack of spacing means that the scallops are incapable of absorbing generally all visible light incident upon the external surface 202 as well as diffusely reflecting generally all the visible light. Furthermore, scallops and craters lack the generally circular shape that is characteristic of the pits (PT). Furthermore, a blasting process is unable to produce the fine scale etching needed to form light-absorbing features (LA).

The etched part 250 includes the light-absorbing features (LA) and the color particles 224 that together combine to impart the etched part 250 with a true black appearance. Accordingly, the anodized layer 206 can be quantified as having an extremely matte black appearance with an L* value of ~1, an a* value of ~0, and a b* value of ~0 using a CIE L*a*b* color space. Furthermore, the light-absorbing feature (LA) defined by the pits (PT) and peaks (PK) are also capable of diffusely reflecting generally all visible light incident upon the external surface 202. Accordingly, the anodized layer 206 can be quantified as having an extremely matte appearance with a gloss unit of <1 as measured at 20 degrees, a gloss unit of <1 as measured at 60 degrees, and a gloss unit of <10 as measured at 85 degrees.

Figure 5:
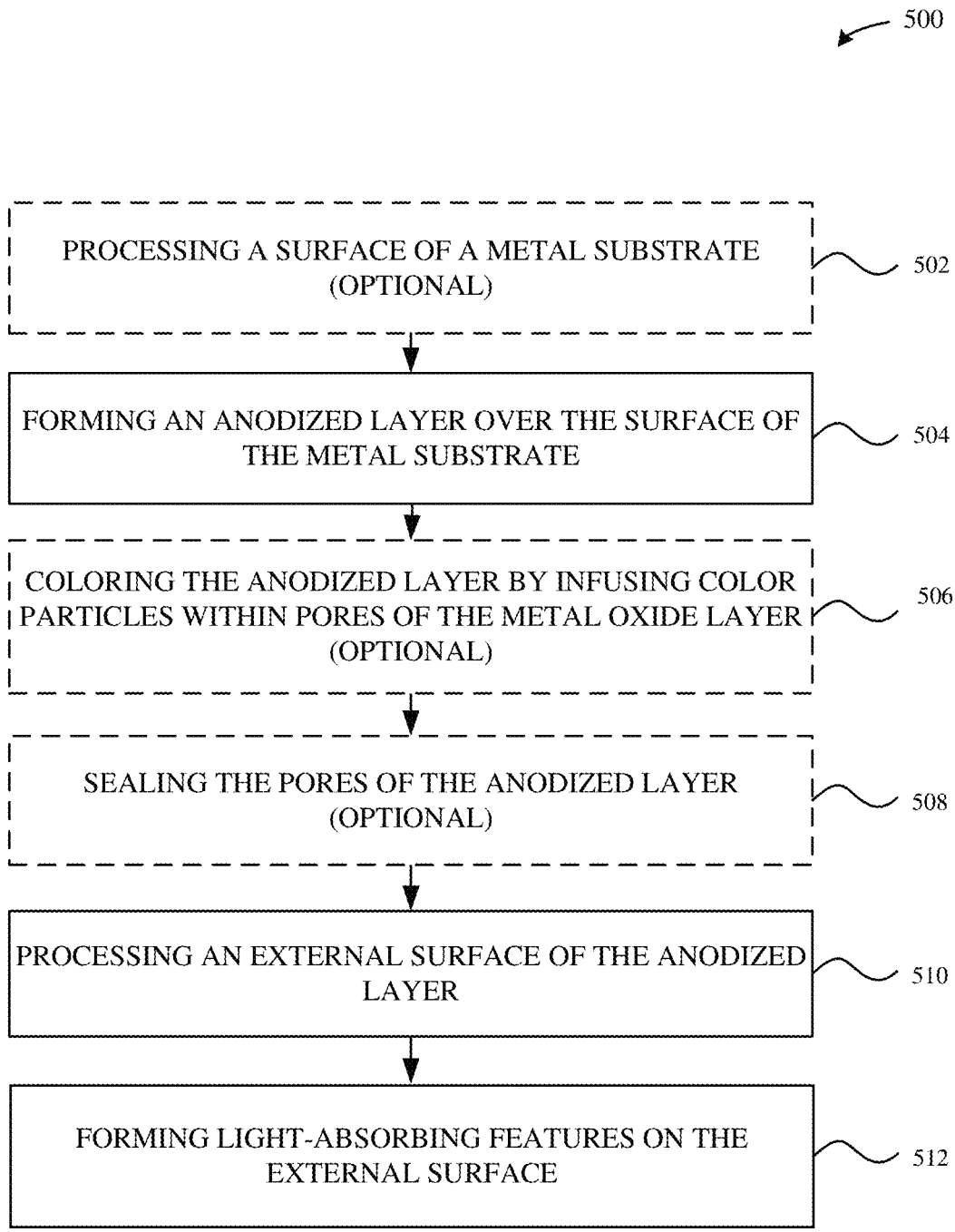
FIG. 5 illustrates a method for forming an anodized part having light-absorbing features, in accordance with some embodiments.

FIG. 5 illustrates a method 500 for forming an etched anodized part having light-absorbing features, in accordance with some embodiments. As illustrated in FIG. 5, the method 500 optionally begins at step 502, where a surface of a part—e.g., a metal substrate 204—is optionally processed. In some examples, the surface of the metal substrate 204 is subject to a cleaning process, a texturizing process, a buffing process, a blasting process, and/or a polishing process.

At step 504, anodizing is performed on the metal substrate 204. During the anodization process, the anodized layer 206 is formed from the metal substrate 204. In some examples, the anodized layer 206 can be formed through exposure to a thermal oxidation process or an electrolytic anodizing solution. Subsequent to the anodization process, the electrolytic anodizing solution can be rinsed off the external surface 202 of the anodized layer 206 with deionized water and a buffer solution. The deionized water functions to stop the chemical reaction(s) associated with the anodization process.

At step 506, the anodized layer 206 can be optionally colored as the result of a dyeing process or an electrocoloring process. During the dyeing process, the anodized part—e.g., the anodized part 210—is exposed to water-soluble dye pigments in a dye solution bath. The anodized part 210 is submerged within the dye solution. The dye pigments become infused within the nanotubes 212 and absorb onto the pore walls 216. Thereafter, the dye solution can be rinsed off the external surface 202 of the anodized layer 206 with deionized water and a buffer solution. The deionized water functions to stop the chemical reaction(s) associated with the dyeing process as well as to stabilize the pH value of the dye. During the electrocoloring process, metals (e.g., Co, Sn, etc.) can be electrodeposited into the nanotubes 212.

At step 508, the nanotubes 212 can be optionally sealed via a sealing process, according to some embodiments. In some instances, sealing the nanotubes 212 can be preferable in that the seal 232 closes the nanotubes 212 such that color particles 224 are retained within the anodized layer 206. The sealing solution can include zinc salt (e.g., zinc acetate, etc.). Thereafter, the sealing solution can be rinsed off the external surface 202 of the anodized layer 206 with deionized water and subsequently dried off.

At step 510, the external surface 202 of the anodized layer 206 of the sealed part 230 can be optionally processed. For example, the anodized layer 206 can be subject to a surface polishing, surface blasting, and the like. It should be noted that processing the external surface 202, such as by a blasting process, does not form light-absorbing features or light-trapping features on the external surface 202.

At step 512, the external surface 202 of the sealed part 230 is subject to an etching process. The etching process is associated with stochastic etching of the pore walls 216 of the nanotubes 212 that causes the nanotubes 212 to have varied heights. The stochastic etching of the pore walls results in the external surface 202 of the anodized layer 206 having an extremely fine surface texture. The etched surface texture creates pits and peaks on the micron and sub-micron scale. According to some examples, the sealed part 230 is etched by exposing the sealed part 230 to a phosphoric acid solution. In some examples, the sealed part 230 is exposed to an 85% phosphoric acid solution at a temperature between about 65°-70° Celsius from between about 15-30 seconds. In excess of 30 seconds, and the seal 232 typically begins to degrade while less than 15 seconds often fails to produce a sufficient amount of etching to form the light-absorbing features. It should be noted that etching a sealed anodized part represents a non-obvious departure from conventional anodizing processes. In particular, in conventional processes, etching is not performed subsequent to the sealing process as etching the sealed part 230 risks degrading the integrity of the seal 232. Furthermore, etching the external surface 202 of the sealed part 230 also reduces the amount of the hydrated material 226 that includes the seal 232; thereby, reducing resistance to corrosion. However, it should be noted that the external surface 202 subsequent to the etching still exhibits some corrosion resistance due to the seal 232 still being generally present.

As a result of the etching process, the external surface 202 of the anodized layer 206 includes at least one light-absorbing feature (LA), where each of the light-absorbing features (LA) is defined by at least one pit (PT) and at least one peak (PK). The light-absorbing features (LA) can be super-imposed generally throughout the entire external surface 202. In some embodiments, the light-absorbing feature (LA) is capable of absorbing generally all visible light incident upon the external surface 202. Moreover, whatever visible light is not absorbed by the light-absorbing features is diffusely reflected by the light-absorbing feature (LA).

Figure 6A:
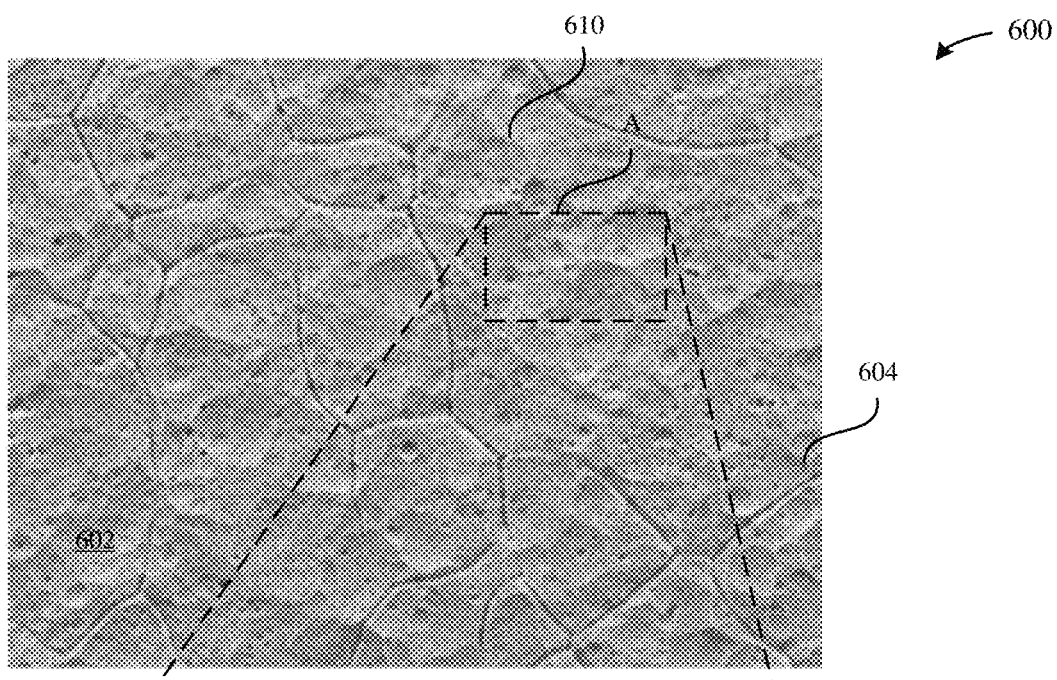
FIGS. 6A-6B illustrate exemplary images of an anodized part having light-absorbing features, in accordance with some embodiments.
Figure 6B:
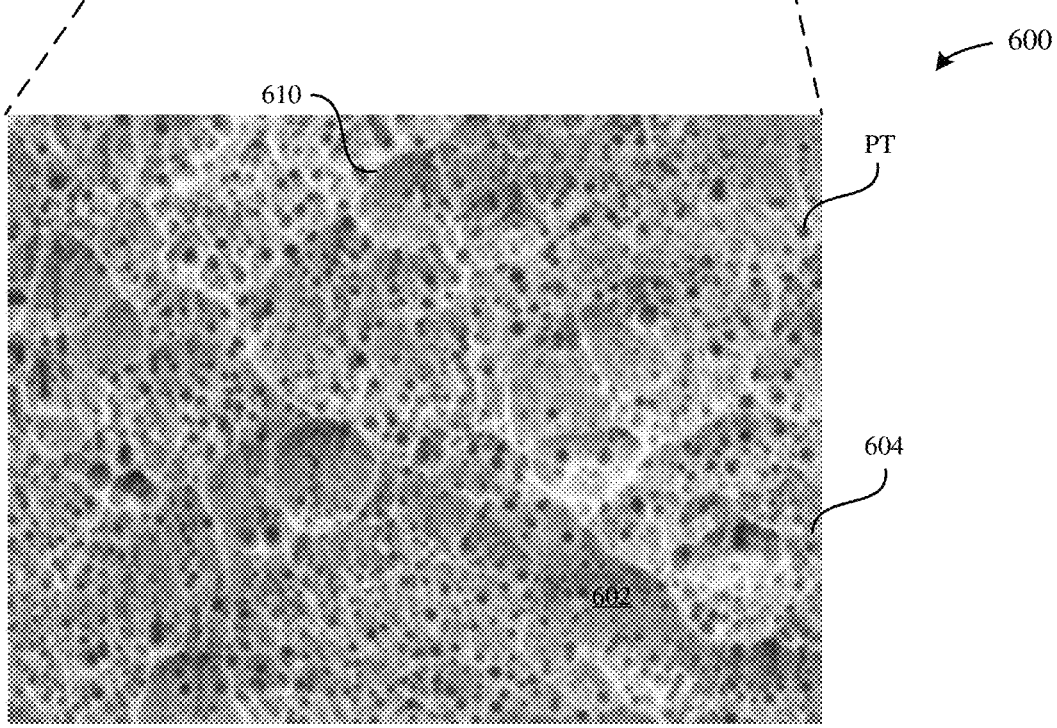

FIGS. 6A-6B illustrate exemplary electron microscope images of an etched anodized part, in accordance with some embodiments. FIG. 6A illustrates an etched anodized part 600 having an anodized layer 604 that includes an external surface 602 having light-absorbing features. Additionally, the external surface 602 includes craters 610 that are the result of a blasting process.

FIG. 6B illustrates a magnified view of Location A. In particular, FIG. 6B illustrates numerous pits (PT) of the light-absorbing features that are randomly distributed throughout the external surface 602. Furthermore, FIG. 6B illustrates that the craters 610 are significantly larger than the pits (PT). Moreover, the craters 610 are shallow (i.e., <0.5 micrometers) while the pits (PT) can be up to 2 micrometers deep.

Figure 7A:
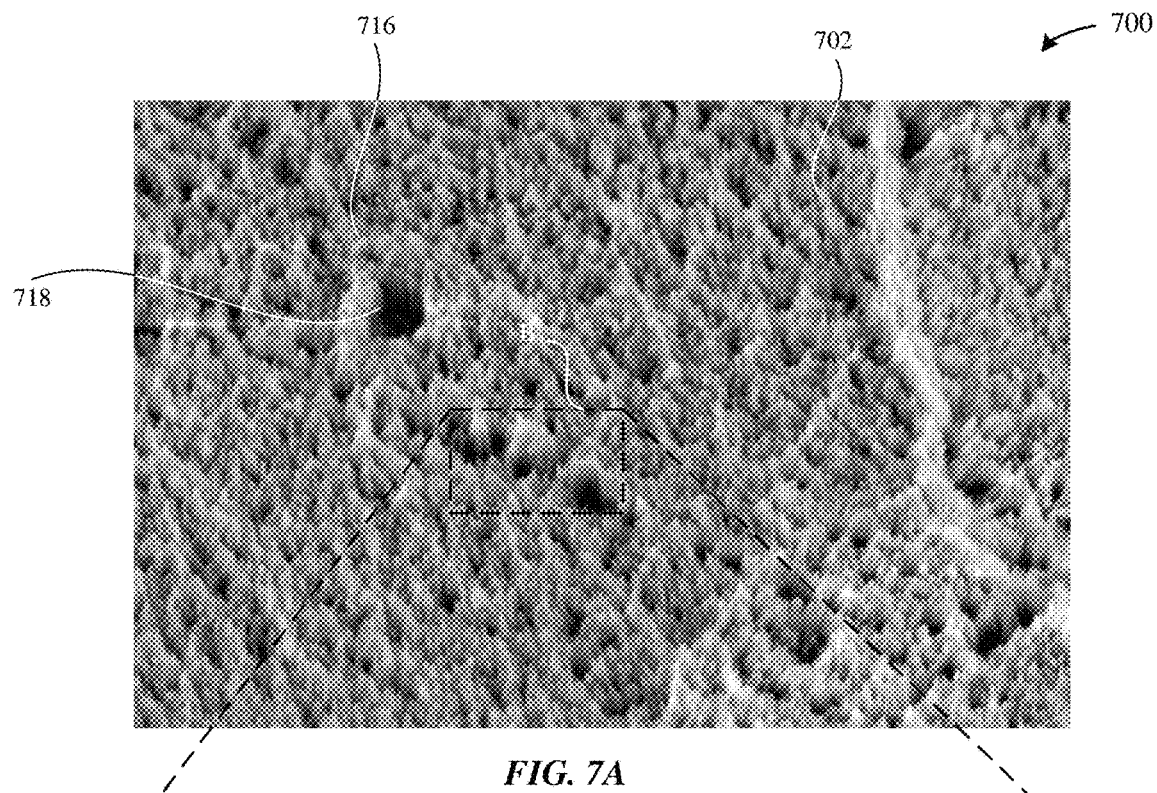
FIGS. 7A-7B illustrate exemplary images of an anodized part having light-absorbing features, in accordance with some embodiments.
Figure 7B:
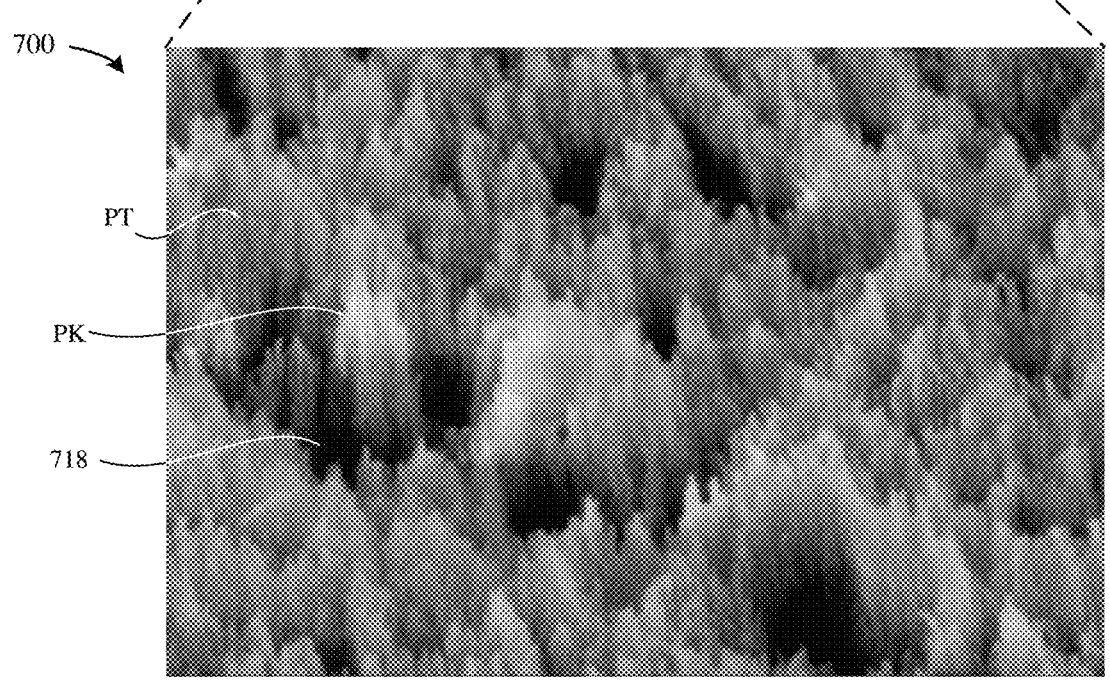

FIGS. 7A-7B illustrate exemplary electron microscope images of an etched anodized part, in accordance with some embodiments. FIG. 7A illustrates a network or forest of fine-scale pits (PT) that are superimposed on an external surface 702 of an anodized layer of an etched anodized part 700. As illustrated in FIG. 7A, the pits (PT) are generally circular in shape and are less than 2 micrometers in diameter. The pits (PT) are formed by etching pore walls 716 of nanotubes. The pore walls 716 define an opening 718 of the nanotubes.

FIG. 7B illustrates a magnified view of Location B (also depicted in FIG. 7A) and demonstrates the extent of the etching along the external surface 702, as well as within the nanotubes. In particular, Location B of FIG. 7B illustrates numerous pits (PT) and peaks (PK) that are randomly distributed throughout the external surface 702. The pits (PT) and peaks (PK) cause the external surface 702 to diffusely reflect visible light incident thereupon. Moreover, the combination of the pits and the peaks with the color particles imparts the anodized part 700 with an extremely matte black appearance with an L* value of ~1, an a* value of ~0, and a b* value of ~0 using a CIE L*a*b* color space.

In some examples, the reflectance spectrum of an anodized part can be measured for a range of wavelengths, such as 400 nanometers (nm)-750 nm, or 400 nm-650 nm. In one particular example, the reflectance spectrum in the range of 400 nm-740 nm of a conventional black anodized part was measured using a Konica Minolta CM3700A spectrophotometer with diffuse illumination and an 8 degree viewing angle. The average reflectance for the conventionally anodized part in this range was found to be 12.6%. The reflectance spectrum in the range of 400 nm-740 nm of an example part prepared according to the processes described herein, such as anodized part 700, was measured using the same spectrophotometer with diffuse illumination and an 8 degree viewing angle. In this particular example, the part was found to have an average reflectance of 1.7%. Further, the part anodized according to the processes described herein was found to have an average reflectance of 0.17% in the range of 400 nm-650 nm. The CIE L*a*b* color of the conventionally anodized part was found to be 31.4 (L*), 0.8 (a*), and −1.7 (b*), while the color of the part anodized according to the processes described herein was found to be 1.5 (L*), −0.0 (a*), and −0.5 (b*).

Figure 8:
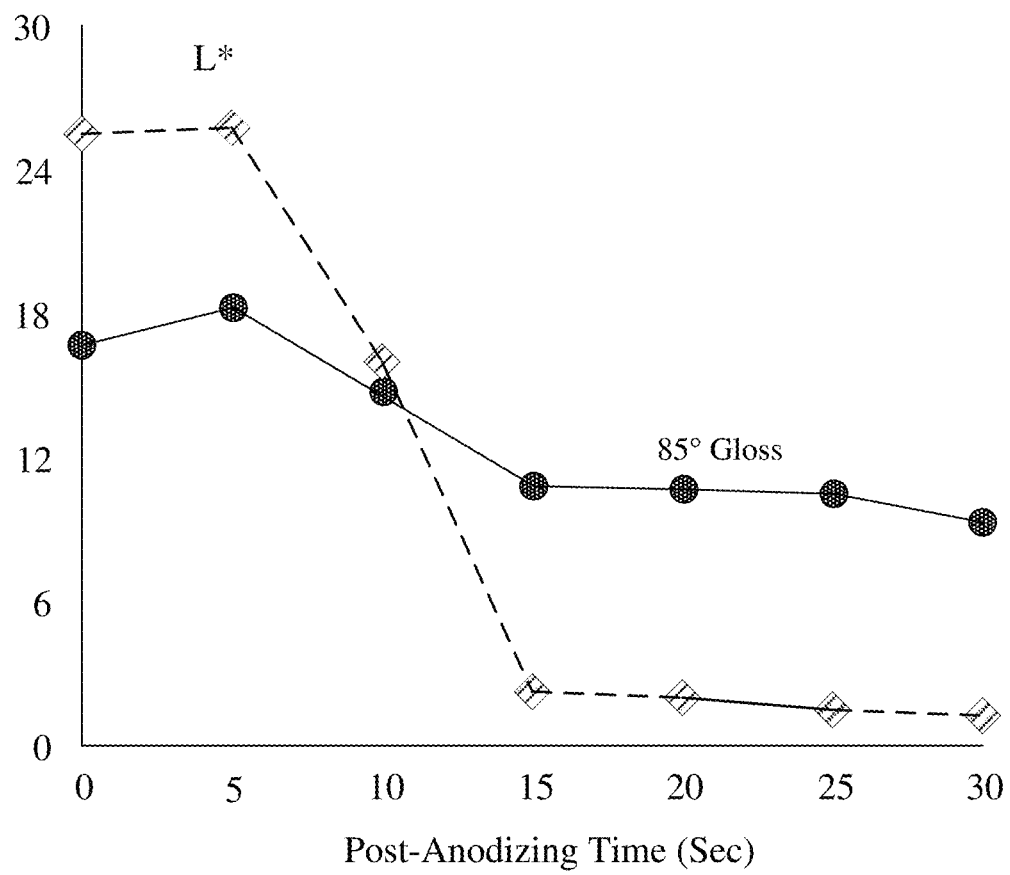
FIG. 8 illustrates an exemplary graph indicating gloss units and L* value using a CIE L*a*b* color space as a function of etching time, in accordance with some embodiments.

FIG. 8 illustrates an exemplary graph that indicates a relationship of gloss units and L* value as a function of etching duration, in accordance with some embodiments. In some examples, a sealed anodized part having an initial L* value of ~25 and a gloss appearance, as measured at 85 degrees, of 17 gloss units prior to an etching process. As described herein, the light-absorbing features require about at least 15 seconds of etching duration. However, an etching duration in excess of about 30 seconds can lead to degradation of the seal.

As illustrated in the exemplary graph, after 15 seconds of etching, the etched anodized part had an L* value of about 2 and 11 gloss units as measured at 85 degrees. After 30 seconds of etching, the etched anodized part had an L* value of about 1 and 10 gloss units as measured at 85 degrees. Aesthetically, the etched anodized part has a matte appearance due to the external surface of the etched anodized part diffusely scattering almost all visible light.

Any ranges cited herein are inclusive. The terms "substantially", "generally," and "about" used herein are used to describe and account for small fluctuations. For example, they can refer to less than or equal to ±5%, such as less than or equal to ±2%, such as less than or equal to ±1%, such as less than or equal to ±0.5%, such as less than or equal to ±0.1%.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments.

Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An anodized part, comprising:
a metal substrate;
an anodized layer overlaying and formed from the metal substrate, the anodized layer having an L* value of less than 10 using a CIE L*a*b* color space;
wherein the anodized layer comprises:
an external surface defining randomly distributed light-absorbing features, the light-absorbing features comprising peaks of varying heights and pits of varying depths superposing nanotubes having non-uniform lengths, wherein the pits have diameters less than 2 micrometers and bottoms of the pits are separated from tops of the peaks by a clearance distance of 2 micrometers or less;
color particles infused within the nanotubes; and
a seal extending into the nanotubes;
wherein the anodized layer has been sealed to a depth of greater than 2 micrometers and subsequently etched to a depth of less than 2 micrometers, thereby etching outer surfaces of the nanotubes and forming the peaks and the pits.

2. The anodized part of claim 1, wherein the external surface comprises a scallop having a diameter of 3 micrometers or greater.

3. The anodized part of claim 1, wherein the color particles comprise dye pigments or an electrodeposited metal.

4. The anodized part of claim 1, wherein the anodized layer has a gloss, as measured at 85 degrees, of less than 10 gloss units.

5. An enclosure for a portable electronic device, the enclosure comprising:
a substrate, the substrate including metal; and
an anodized layer that overlays the substrate, wherein the anodized layer comprises:
nano-scale tubes having non-uniform lengths;
color particles infused in the nano-scale tubes;
an external surface having peaks of varying heights that are separated by pits of varying depths and that each superpose the nano-scale tubes, wherein the pits have diameters less than 2 micrometers and bottoms of the pits are separated from tops of the peaks by a clearance distance of 2 micrometers or less; and
a seal extending into the nano-scale tubes
wherein:
the anodized layer has a gloss appearance, as measured at 85 degrees, of less than 10 gloss units;
the anodized layer has an L* value of less than 10 using a CIE L*a*b* color space; and
the anodized layer has been sealed to a depth of greater than 2 micrometers and subsequently etched to a depth of less than 2 micrometers, thereby etching outer surfaces of the nano-scale tubes and forming the peaks and the pits.

6. The enclosure of claim 5, wherein openings of the nano-scale tubes are sealed by the seal.

7. The enclosure of claim 5, wherein the enclosure is a thermal dissipation component.

8. The enclosure of claim 5, wherein the color particles comprise dye pigments or an electrodeposited metal.

9. A method for forming an enclosure for a portable electronic device, the method comprising:
forming an anodized layer that overlays a metal substrate;
infusing color particles within nanotubes of the anodized layer;
sealing the nanotubes with a seal to a depth of greater than 2 micrometers; and
forming light-absorbing features on an external surface of the anodized layer by etching the seal and outer surfaces of the nanotubes, wherein the seal is etched to a depth of less than 2 micrometers and the nanotubes are etched to have non-uniform lengths such that the anodized layer has a color having an L* value less than 10 using a CIE L*a*b* color space and the seal defines one or more of the light-absorbing features, the light-absorbing features being defined by peaks of varying heights and pits of varying depths superposing the nanotubes, wherein the pits have diameters less than 2 micrometers and bottoms of the pits are separated from tops of the peaks by a clearance distance of 2 micrometers or less.

10. The anodized part of claim 1, wherein:
the non-uniform lengths of the nanotubes are in a range from 10 micrometers to 20 micrometers.

* * * * *